(12) United States Patent
Khuat Duy et al.

(10) Patent No.: US 9,488,465 B2
(45) Date of Patent: Nov. 8, 2016

(54) LEVEL SENSOR, A METHOD FOR DETERMINING A HEIGHT MAP OF A SUBSTRATE USING A SELECTED RESOLUTION, AND A LITHOGRAPHIC APPARATUS

(71) Applicant: ASML Netherlands B.V., Veldhoven (NL)

(72) Inventors: Laurent Khuat Duy, Eindhoven (NL); Martinus Cornelis Reijnen, Tilburg (NL); Lukasz Jerzy Macht, Eindhoven (NL); Erik Johan Koop, Eindhoven (NL)

(73) Assignee: ASML Netherlands B.V, Veldhoven (NL)

( * ) Notice: Subject to any disclaimer, the term of this patent is extended or adjusted under 35 U.S.C. 154(b) by 169 days.

(21) Appl. No.: 13/679,898

(22) Filed: Nov. 16, 2012

(65) Prior Publication Data
US 2013/0128247 A1 May 23, 2013

Related U.S. Application Data

(60) Provisional application No. 61/562,225, filed on Nov. 21, 2011.

(51) Int. Cl.
*G01B 11/00* (2006.01)
*G03B 27/34* (2006.01)
*G01B 11/06* (2006.01)
*G03F 9/00* (2006.01)

(52) U.S. Cl.
CPC ........... *G01B 11/00* (2013.01); *G01B 11/0608* (2013.01); *G03B 27/34* (2013.01); *G03F 9/7034* (2013.01)

(58) Field of Classification Search
CPC ...................................................... G03F 9/7034
USPC ........................................... 356/630; 355/55
See application file for complete search history.

(56) References Cited

U.S. PATENT DOCUMENTS

| 6,118,515 A | 9/2000 | Wakamoto et al. |
| 6,674,510 B1 * | 1/2004 | Jasper et al. .................... 355/55 |
| 7,704,826 B2 | 4/2010 | Lim |

(Continued)

FOREIGN PATENT DOCUMENTS

| JP | 10-082611 A | 3/1998 |
| JP | 2000-091199 A | 3/2000 |

(Continued)

*Primary Examiner* — Chia-How Michael Liu
(74) *Attorney, Agent, or Firm* — Sterne, Kessler, Goldstein & Fox P.L.L.C.

(57) ABSTRACT

The invention provides a level sensor configured to determine a height level of a surface of a substrate, comprising a detection unit arranged to receive a measurement beam after reflection on the substrate, wherein the detection unit comprises an array of detection elements, wherein each detection element is arranged to receive a part of the measurement beam reflected on a measurement subarea of the measurement area, and is configured to provide a measurement signal based on the part of the measurement beam received by the respective detection element, and wherein the processing unit is configured to calculate, in dependence of a selected resolution at the measurement subarea, a height level of the measurement subarea, or to calculate a height level of a combination of multiple measurement subareas.

49 Claims, 3 Drawing Sheets

(56) References Cited

U.S. PATENT DOCUMENTS

| | | |
|---|---|---|
| 8,619,235 B2 | 12/2013 | Van Drent |
| 2002/0041367 A1 | 4/2002 | Oguri et al. |
| 2004/0130691 A1* | 7/2004 | Boonman et al. .............. 355/53 |
| 2005/0134816 A1* | 6/2005 | Modderman et al. .......... 355/53 |
| 2006/0130692 A1 | 6/2006 | Peterman et al. |
| 2007/0188756 A1 | 8/2007 | Lim |
| 2007/0252963 A1* | 11/2007 | Modderman et al. .......... 355/53 |
| 2009/0079949 A1* | 3/2009 | Streefkerk et al. ............. 355/30 |
| 2010/0231889 A1* | 9/2010 | Den Boef ....................... 355/72 |
| 2011/0164229 A1* | 7/2011 | Staals et al. .................... 355/53 |
| 2012/0013879 A1* | 1/2012 | Den Boef et al. .............. 355/67 |

FOREIGN PATENT DOCUMENTS

| | | |
|---|---|---|
| JP | 2002-100552 A | 4/2002 |
| JP | 2003-115454 A | 4/2003 |
| JP | 2007-192685 A | 8/2007 |
| JP | 2011-209278 A | 10/2011 |

* cited by examiner

LEVEL SENSOR, A METHOD FOR DETERMINING A HEIGHT MAP OF A SUBSTRATE USING A SELECTED RESOLUTION, AND A LITHOGRAPHIC APPARATUS

BACKGROUND

1. Field of the Invention

The present invention relates to a level sensor, a method for determining a height map of a substrate, and a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The surface of a substrate on which a pattern should be projected is usually not completely flat. Moreover substrates can show thickness variations of several microns. This flatness and thickness variations of the substrate surface may result in incorrect projection of the pattern, for instance due to focus errors or imaging errors.

To correct for unflatness and thickness variations of a wafer, it has been proposed to provide a level sensor, preferably integrated in the lithographic apparatus. Such level sensor may be used to determine a height map of a substrate, before a pattern is projected on the substrate. This height map may subsequently be used to correct the position of the substrate during projection of the pattern on the substrate.

In a known embodiment a multiple spot level sensor using optical triangulation is provided to determine a height map of the substrate. The known embodiment comprises a projection unit with nine light sources to project nine measurement beams on the substrate, and a detection unit comprising nine detection sensors each arranged to receive one of the measurement beams after reflection on the substrate surface. On the basis of the measurement signals provided by the detection sensors a height level of the substrate surface may be determined.

However, a substrate surface may comprise areas where the height level of the substrate cannot be determined, for example close to the edges of the substrate, or where the height level of the substrate surface cannot be determined with high accuracy, for instance at scribe lanes. When a measurement beam partly falls on one of these problem areas, it is desirable to disregard the height level obtained with the associated detection sensor. This has the result that the whole measurement area is disregarded although only a part of this measurement area is a problem area. When the presence of a problem area is not recognized or acknowledged, the calculated height level of the spot wherein the problem area resides may be incorrect leading to a less accurate height map, and as a result in overlay errors and/or focus errors due to incorrect or suboptimal leveling during the lithographic process.

To increase the area to be measured, U.S. Pat. No. 7,704,826, which is incorporated by reference herein, discloses a level sensor comprising a projection unit comprising nine light sources to project nine measurement beams on the substrate surface and nine detection units arranged to receive the nine measurement beams after reflection on the substrate surface. The detection unit comprises nine two-dimensional arrays each comprising a plurality of cells. Each of the nine measurement beams is received by one of the cell arrays. A selection unit is provided to select a number of the cells of the cell array as available cells. The available cells are used to obtain a measurement signal representative for a height level of the substrate surface. The available cells are selected to exclude problem areas on the substrate surface.

SUMMARY

It is desirable to provide a level sensor that provides more flexibility and/or efficiency in determining the height level of a substrate surface, or at least to provide an alternative embodiment of a level sensor.

According to an embodiment of the invention, there is provided a level sensor configured to determine a height level of a surface of a substrate, comprising:

a projection unit configured to project a measurement beam on a measurement area of the substrate, a detection unit arranged to receive the measurement beam after reflection on the substrate, and a processing unit to calculate a height level within the measurement area based on the reflected measurement beam, wherein the detection unit comprises an array of detection elements, wherein each detection element is arranged to receive a part of the measurement beam reflected on a measurement subarea of the measurement area, and is configured to provide a measurement signal based on the part of the measurement beam received by the respective detection element, and wherein the processing unit is configured to calculate, in dependence of a selected resolution at the measurement subarea, a height level of the measurement subarea based on the measurement signal of the associated detection element, or to calculate a height level of a combination of multiple measurement subareas within the measurement area based on the measurement signals of the multiple detection elements associated with the combination of multiple measurement subareas.

According to an embodiment of the invention, there is provided a method for determining a height map of a substrate for use in a lithographic process comprising the steps of:

providing a level sensor configured to determine a height level of a surface of a substrate, comprising:

projection unit configured to project a measurement beam on a measurement area of the substrate, a detection unit arranged to receive the measurement beam after reflection on the substrate, and a processing unit to calculate a height level within the measurement area based on the reflected measurement beam, wherein the detection unit comprises an array of detection elements, wherein each detection element is arranged to receive a part of the measurement beam reflected on a measurement subarea of the measurement area, and is configured to provide a measurement signal based on the part of the measurement beam received by the respective detection element, and wherein the processing unit is configured to calculate, in dependence of a selected resolution at the measurement subarea, a height level of the measurement subarea based on the measurement signal of the associated detection element, or to calculate a height level of a combination of multiple measurement subareas within the measurement area based on the measurement signals of the multiple detection elements associated with the combination of multiple measurement subareas, providing a substrate, determining a height level of a subarea or combination of subareas within a measurement area comprising:

projecting a measurement beam on the substrate by the projection unit, receiving the reflected beam by said detection unit, and calculating, in dependence of a selected resolution at the measurement subarea, a height level of the measurement subarea based on the measurement signal of the associated detection element, or a height level of a combination of multiple measurement subareas within the measurement area based on the measurement signals of the multiple detection elements associated with the combination of multiple measurement subareas.

According to an embodiment of the invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the lithographic apparatus comprises a level sensor configured to determine a height level of a surface of a substrate supported on the substrate table, comprising:

a projection unit configured to project a measurement beam on a measurement area of the substrate, a detection unit arranged to receive the measurement beam after reflection on the substrate, and a processing unit to calculate a height level within the measurement area based on the reflected measurement beam, wherein the detection unit comprises an array of detection elements, wherein each detection element is arranged to receive a part of the measurement beam reflected on a measurement subarea of the measurement area, and is configured to provide a measurement signal based on the part of the measurement beam received by the respective detection element, and wherein the processing unit is configured to calculate, in dependence of a selected resolution at the measurement subarea, a height level of the measurement subarea based on the measurement signal of the associated detection element, or to calculate a height level of a combination of multiple measurement subareas within the measurement area based on the measurement signals of the multiple detection elements associated with the combination of multiple measurement subareas.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Figure 1:
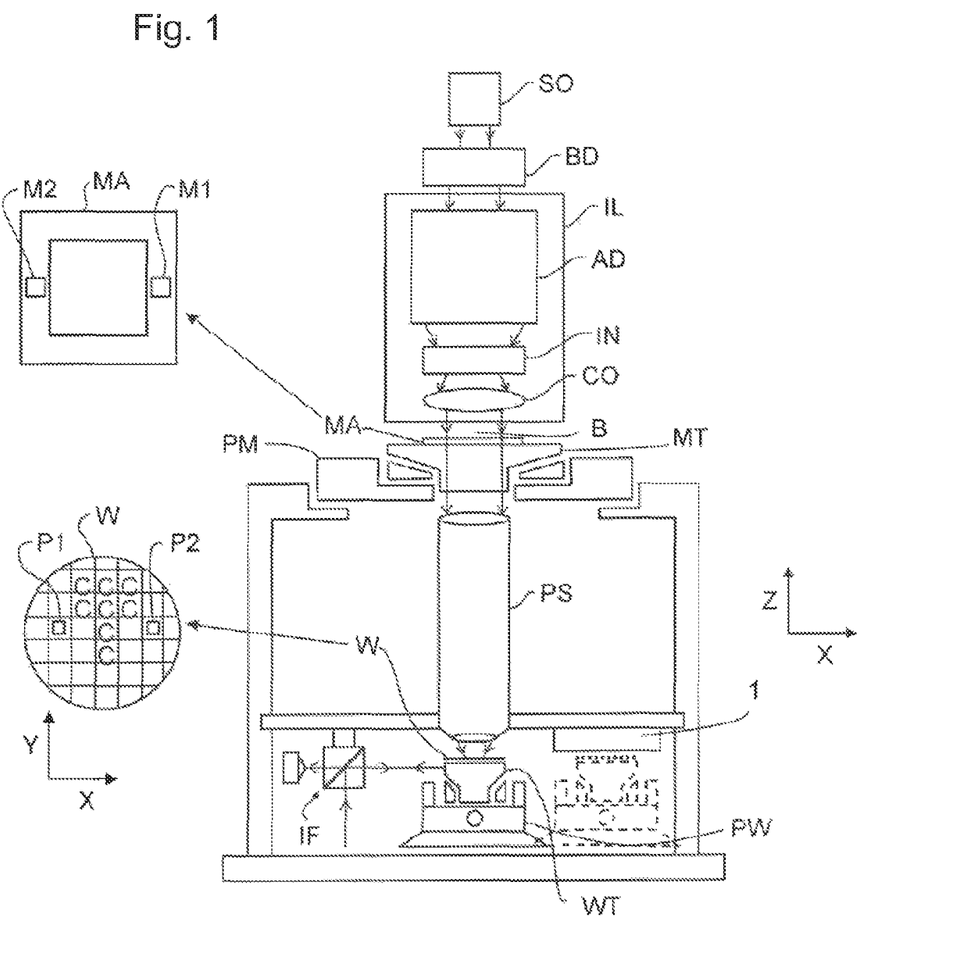
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In FIG. 1 the possible location of a level sensor 1 according to the invention in a lithographic apparatus is shown. The substrate support WT and substrate W supported thereon are shown in dashed lines in a measurement location of the substrate. In this measurement location a height level of the substrate W may be determined.

A previous Level Sensor (LS) may have a camera that is designed to receive 18 sensing spots (ignoring the capture spots), organized in 2 rows of 9 spots. Each of the 9 pairs of spots contains an e-spot and an o-spot. The wafer level at these 9 positions can then be directly calculated from the contrast c between these two spots according to the following equation (where $I_e$ is the intensity of the e-spot and $I_o$ is the intensity of the o-spot):

$$c = \frac{I_e - I_o}{I_e + I_o}$$

Figure 2:
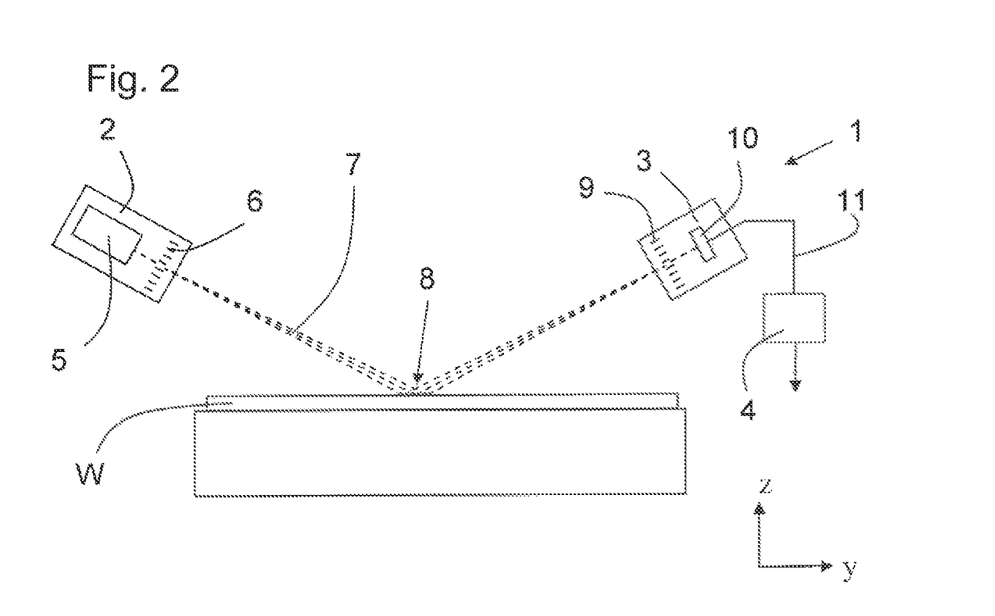
FIG. 2 depicts a side view of an embodiment of a level sensor according to the invention.
Figure 3:
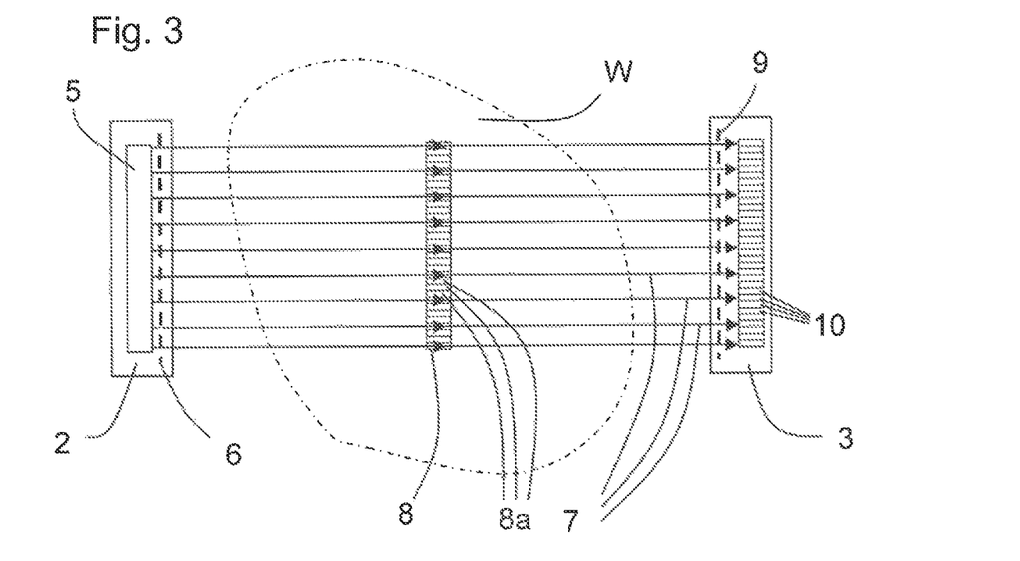
FIG. 3 depicts a top view of the level sensor of FIG. 2.

FIG. 2 shows schematically a level sensor generally indicated by reference numeral 1. FIG. 3 shows a schematic top view of the level sensor 1. The processing unit 4 is not shown in FIG. 3, and a part of the surface of the substrate W is indicated by a chain dotted line. This part comprises a measurement area 8 for which the height of the surface of the substrate W is to be determined. To achieve a height map of the complete wafer surface the level sensor measures and determines the height of the complete wafer surface.

The level sensor 1 is configured to determine a height map of a surface of a substrate W. This height map may be used to correct the position of a substrate during projection of a pattern on the substrate W. The level sensor may be arranged in a stand-alone device, but is preferably integrated in a lithographic apparatus similar to the lithographic apparatus as shown in FIG. 1.

The level sensor 1 comprises a projection unit 2, a detection unit 3, and a processing unit 4.

The projection unit 2 comprises a light source 5 and a projection grating 6. The light source 5 may be any suitable light source. It is preferably a broadband light source but a polarized or non-polarized laser beam can also be used. The light source 5 provides a measurement beam 7, which is directed to the projection grating 6. The projection grating 6 comprises a pattern resulting in a patterned measurement beam 7.

The measurement beam 7 is directed towards a measurement area 8 on the substrate. Optical elements may be provided to guide the measurement beam towards the substrate W. It is remarked that the substrate W and/or the level sensor 1 may be moved with respect to each other to align different measurement areas 8 on the substrate surface with the measurement beam 7. The single light source 5 covers the whole measurement area 8. In alternative embodiments two or more light sources may be provided to cover the measurement area 8.

The detection unit 3 is arranged to receive the measurement beam 7 after reflection on the substrate W. The detection unit 3 comprises a detection grating 9 and at least one-dimensional array of detection elements 10, for example a CMOS or CCD sensor. The one-dimensional array of detection elements 10 may be a continuous array of detection elements 10 made up by a single CMOS or CCD sensor. These CMOS or CCD sensors are widely available and relatively cheap. The array may for instance comprise a row of 1024 pixels, each pixel forming a detection element 10. A continuous array may have the advantage that all detection elements 10, for example pixels, are arranged adjacent to each other and fit together so that there is no light loss between the detection elements 10, and as a result also no information loss with respect to the height of the surface area of the substrate within the measurement area 8. Furthermore, continuous arrays may easily be replaced by other arrays, for example when an array is damaged or when another resolution is desired.

Each detection element 10 is associated with a measurement subarea 8a of the measurement area 8, i.e., the detection element 10 receives a part of the measurement beam 7 reflected by the respective measurement subarea 8a of the measurement area 8. Thus, the amount of light received by a detection element 10 relates a height level of the associated measurement subarea 8a.

It is remarked that in general a conventional nine-spot level sensor can relatively easily be adapted by swapping the nine detection sensors by an array of detection elements, having a number of substantially more than nine detection elements 10. The projection grating and the detection grating can be maintained. The light source can be maintained or changed for a single light source covering the whole measurement area or for two or more light sources covering the whole measurement area.

The array of detection elements 10 may have dimensions corresponding to the dimensions of the combination of nine detection spots of a conventional detection unit. These dimensions may for instance be 20 mm-40 mm in length and 0.5 mm-2 mm in width. Any other suitable dimensions may also be applied. The array may comprise over 500, or over 1000 pixels.

The detection grating 9 is arranged to receive, at least partly, the measurement beam 7, and the light of the measurement beam 7 transmitted by the detection grating 9 will be received by the detection elements 10. The detection elements 10 are each configured to provide a measurement signal 11 based on the amount of light received by the respective detection element 10. The measurement signals 11 of the detection elements 10 are fed to the processing unit 4.

It is remarked that to increase the sensitivity of the detection unit 3, two or more arrays of detection elements 10 may be provided, wherein each array is arranged to receive substantially the same part of the reflected measurement beam 7. In such embodiment, each array of detection elements may be formed by a single continuous array of detection elements, for example a CMOS or CCD sensor. Preferably both arrays are formed by the same or substantially the same sensors. In one embodiment, one array receives the e-spot and the other receives the o-spot. An alternative would be to use a single cell array to measure the intensity coming from both spots.

Furthermore, capture spots, as present in conventional detection units may also be provided.

The processing unit 4 is configured to calculate a height level within the measurement area 8 based on the measurement signals 11 of the detection elements 10. Each detection element 10 is associated with a measurement subarea 8a of the measurement area 8. Thus, each detection element 10 can be used to determine a height level of the respective measurement subarea 8a of the measurement area 8.

When the processing unit 4 is configured to calculate a height level for each measurement subarea a height map of the surface of the substrate W with high resolution can be obtained.

It is also possible to use the measurement signals 11 of multiple detection elements 10 to calculate a height level of the surface of the substrate W at the combination of measurement subareas 8a associated with the combination of multiple detection elements 10. Calculating a height level of a combination of multiple measurement subareas results in a larger area of which one height level is calculated, and thus in a lower resolution.

Generally, the advantage of a higher resolution is that a more accurate height map of the surface of the substrate W is obtained. However, a higher resolution results in more data that has to be handled by the processing unit and further control devices of the lithographic apparatus. A height map with higher resolution may also result in more movement being performed during the projection process due to leveling movement of the substrate stage. This may result in lower throughput.

On a surface of a substrate different areas may be used for different features. For example, some features that are present or will be projected on the substrate surface may be critical substrate/product areas. The height level in these areas may be determined with high resolution. In other areas the height level may be less important and/or the height level may suffer from minor variations over an area extending over a number of measurement subareas. In these areas a lower resolution may be used.

Furthermore, the processing unit 4 may be configured to disregard a measurement signal of a detection element associated with a measurement subarea, of which a height level is undesirable, unreliable and/or non-interesting in a height map of a substrate surface, i.e., for a measurement subarea where a problem area is present. When such problem area is known, due to the known product layout, or detected, due to unlikely measurement results, the measurement signals obtained from these areas can be disregarded. In the height map the height level of these areas can for example be filled based on the information of adjacent measurement subareas. In another approach, in selecting the spot size of a combination of multiple measurement subareas, the problem areas can be excluded to decrease the effect of the problem areas. Measurement subareas corresponding to the actual problem area can be excluded, and measurement subareas close but not in the problem areas can be taken into account to determine a height map of the substrate.

Thus, the level sensor 1 makes it possible to adapt the spot size and spot location to the product layout, for instance to the presence of areas of special interest and the presence of problem areas, or to the field area and/or product size. In particular, it is possible to adapt the resolution in dependence of the feature layout on the substrate surface.

The selection of a resolution for a certain measurement subarea can be based on two principles or a combination of these two principles. The two principles are here described as a feedforward and feedback selection.

In the feedforward principle of selection of resolution, the resolution is selected based on the known layout features of the substrate/product. Since the feature layout is known, the resolution of a determination of a height level in measurement subareas can be selected based on the respective layout at the measurement subarea. For example, at critical substrate/product features, the resolution may be selected high, the measurement signal 11 of one or a small number of detection elements 10 is used to calculate a height level of the associated measurement subarea or combination of measurement subareas, while at other less critical area a height level is calculates for a larger number of measurement subareas based on the measurement signals 11 of a larger number of associated detection elements 10. In the feedforward principle, also problem areas may be identified and measurement signals obtained from measurement subareas corresponding to the problem areas may be planned to be disregarded during the measurement process.

In the feedback principle of selection of resolution, the resolution is selected based on the measurement signals 11 obtained from the detection elements 10 of the detection unit 3. For example, when the measurement signals 11 of adjacent detection elements 10, or a derivative thereof, are the same or substantially the same, these measurement subareas may be combined to a combination of multiple measurement subareas for which only one height level is determined. When the measurement signals 11 of adjacent detection elements 10, or a derivative thereof, are distinctively different a higher resolution may be desirable, and a height level for each measurement subarea or for a combination of a relatively low number of measurement subareas may be calculated, resulting in a higher resolution. When unlikely measurement signals 11 are obtained, these measurement signals 11 may be considered to represent a problem area, and these measurement signals can be disregarded. It is remarked that unlikely measurement signals may for example appear as unlikely measurement values or as unlikely differences in measurement values between adjacent measurement detection elements 10.

As remarked above a combination of the feedforward principle and the feedback principle may also be applied. For example a feedforward principle may be used to plan a resolution to be used, and the resolution is, when deemed needful, adapted based on the feedback principle.

Figure 4:
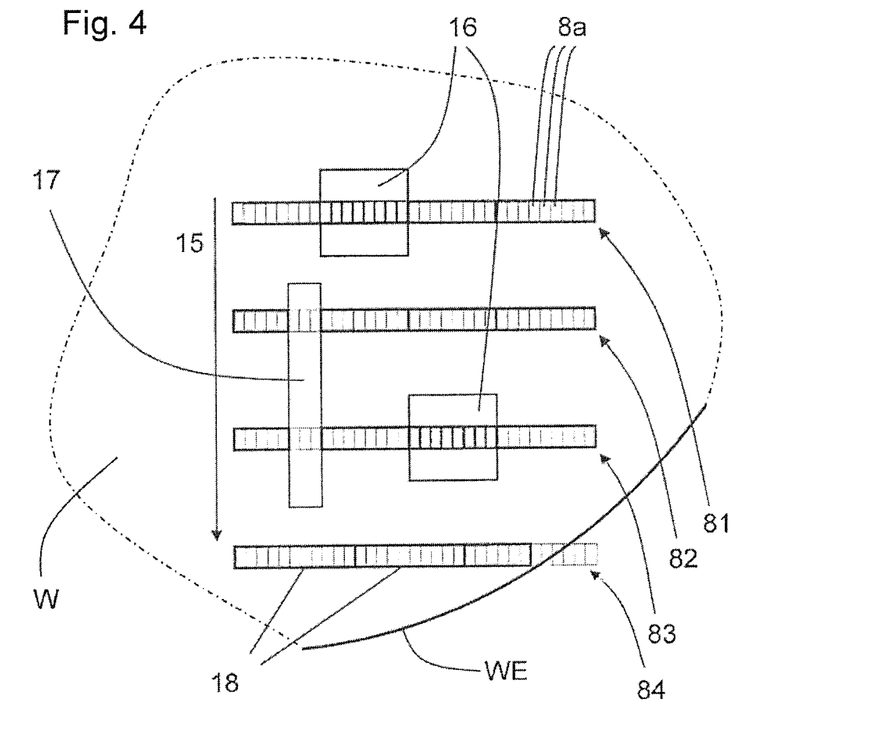
FIG. 4 depicts measurement areas comprising measurement subareas on a substrate surface.

FIG. 4 shows schematically a top view of a part of the surface of a substrate W. The chain dotted line shows a contour on the surface of the substrate W, and the line indicated by WE shows a substrate edge.

On the surface of the substrate W different measurement areas 8 are indicated. The measurement areas 81, 82, 83, 84 relate to relative positions of the substrate W with respect to the level sensor 1. Thus in four different positions of the substrate W with respect to the level sensor 1, the corresponding measurement areas of the relative positions are shown. In practice, the substrate W may be moved with a scanning movement along the level sensor 1 to align the different parts of the surface of the substrate with the measurement location of the level sensor 1. This scanning movement is indicated by the arrow 15. By moving the substrate W with respect to the level sensor such that the measurement area 8 is moved over the whole surface of the surface of the substrate a height map of substantially the whole surface of the substrate W may be obtained.

Each of the measurement areas 81, 82, 83, 84 comprises a number of measurement subareas 8a corresponding to the measurement range of the associated detection elements 10 of an array of detection elements 10. One or more measurement subareas may form a measurement spot used to determine a height level for this subarea or combination of subareas. The measurement spots are indicated by relative thick solid lines and as will be described below they can be layout dependent.

The measurement areas 81, 82, 83, 84 will now be discussed in more detail.

The first measurement area 81 covers a feature 16 having a high focus sensitivity. In view of the high focus sensitivity, it is desirable to have a high resolution in the part of the measurement area 81 covering the feature 16. To obtain a high resolution, each measurement subarea 8a in this measurement area 81 is selected as a separate measurement spot. Thus, the measurement signals 11 of each of the detection elements 10 associated with the measurement subareas 8a overlapping with the feature 16 are used to provide a height level of the respective measurement subarea 8a. In the rest of the measurement area 81, a lower resolution is sufficient, and three measurement spots may be used to cover this rest of the measurement area 81.

The second measurement area 82 covers part of a problem area 17. It is not desirable to use the measurement signals resulting from this problem area to calculate a height level of the surface of the substrate W. The processing unit 4 is configured to ignore the measurement signals 11 of the detection elements 10 associated with the part of the measurement area 82 covering the problem area 17. The rest of the measurement area 82 is divided in four measurement spots to obtain a desired resolution in this area. In the height map of the substrate surface a height level of the problem area may be calculated based on the height levels calculated for the measurement spots adjacent to the problem area.

The third measurement area 83 covers both a part of a feature 16 having a high focus sensitivity and a problem area 17. Corresponding to the measurement area 81, the resolution in the measurement area 83 overlapping the feature 16 is selected relatively high, whereby for each measurement subarea 8a a separate height level is calculated. Corresponding to the measurement area 82, the measurement signals 11 of the part of the measurement area 83 overlapping the problem area 17 are ignored. The rest of the measurement area is divided in similar measurement spots resulting in a selected resolution for these areas. The resolution may however be selected at any desirable level.

The fourth measurement area 84 extends over the substrate edge WE and falls partly outside the surface of the substrate W. The part of the measurement area outside the surface of the substrate W can also be regarded as a problem area as the measurement signals 11 obtained from the detection elements 10 associated with this part will provide unreliable results for calculation of a height level. With the level sensor 1 of the invention, the measurement spot can be precisely selected such that a height level can be determined very close to the substrate edge WE and, when desired, with high resolution. The rest of the measurement area 84 can be measured at a desired resolution by selecting the number of detection elements 11 used for each measurement spot.

By determining a height level for each location on the surface of the substrate with a selected resolution a height map for the whole substrate surface can be obtained.

Hereinabove an embodiment of a level sensor according to the invention has been described. The level sensor has the advantage that the resolution can be selected in dependence of any desired parameter. Thereby, measurement spots made up out of one measurement subarea or a combination of multiple subareas may be used. These measurement spots do not have to have the same size. The selected spots can be made dependent on the feature layout of the substrate W, and the size of the spots may be dynamically adjusted. Further, the measurement spots and the resolution may be selected based on historical data, like data from past leveled wafers and/or past leveled areas so that wafer-to-wafer history data and/or interfield fingerprint data are taken into account.

This freedom in the selection of the resolution, and thus the number of spots, their position and the individual spot size, can guarantee the same coverage of field area for all fields while the wafer mapping routing is principally layout independent. This may lead to predictable and high throughput.

Furthermore, the dynamic spot selection allows wafer area coverage up to a focus edge clearance area (FEC-area) regardless of product layout. This enables having at least 2 data spots to create Z,Ry exposure setpoints, and thus improves focus performance on edge fields.

Furthermore, specific regions, even of small dimensions, of high process dependency can be ignored by not using the corresponding detection elements. When necessary, interpolation may be used to fill the ignored area.

High lateral resolution allows customization of the level sensor area coverage with respect to focus sensitive parts of the substrate/product features, e.g., focus critical parts can be measured with higher resolution, i.e., with more spots than other areas to reduce potential focus errors. The size of the spots can be tailored to the particular features of the product. In particular, a high resolution around the edge clearance can be achieved.

With the method according to the invention processing load can be adapted: for example, a 30 mm field can be decomposed into 2 areas of 12 mm and one of 6 mm. The intensities are added up "per spot," and the processing load is equivalent to process three spots, instead of nine spots as would be the case with a conventional level sensor as described before. The numbers can be adjusted as needed, e.g., depending on the models and the ever-improving hardware processing capabilities.

With the level sensor of the invention a high resolution height map can be made for diagnostics or research purposes. For example wafer table cleaning and wafer load offset can be improved based on the higher lateral accuracy. Also, spot detection, but also focus spot monitoring during lot production may improve, due to full and continuous wafer coverage.

In the shown embodiment, the use of a photosensitive array of detection elements 10 instead of conventional photodiodes is proposed. This embodiment may have the advantage of a lowering of the SNR. The conventional photo diodes need to be relatively large to cope with the position tolerance of the spots, thereby adding more dark noise. When instead of a conventional photo diode a photosensitive array according to the invention is used with the opportunity to only use the signal from selected detection elements 10, the dark noise might be decreased thus improving the SNR, for example.

Wavelength-dependent sensitivity may result from manufacturing variations in the passivation layers on the PDA's (Photodiode Arrays); ideally, each pair of photodiodes is closely matched, per wavelength. With a commercial array, however, the specifications are not as tightly controlled. These differences can be averaged-out by combining readings from many pixels. Alternatively, calibration can be done to remove the differences. Another approach may be to provide an intermediate conversion layer, sensitive to broadband light, and emitting at a single wavelength. This would make the matching much easier, potentially allowing commercial CMOS arrays to be used.

Figure 5:
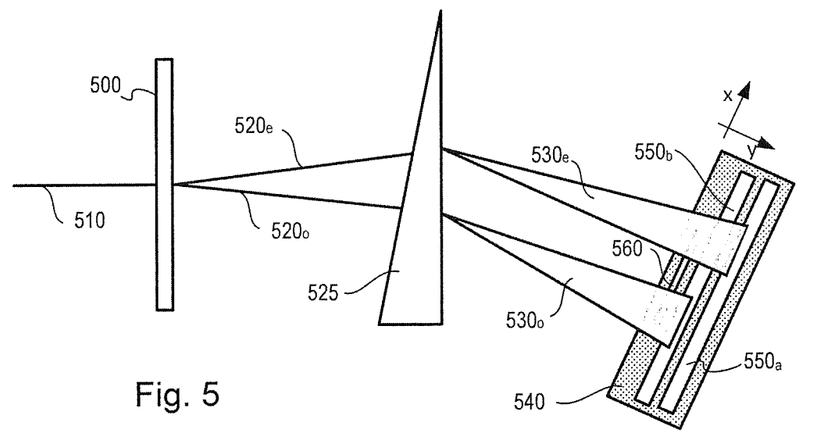
FIG. 5 shows an embodiment in which a device is provided that spectrally decomposes the light before sensing by the photosensitive array, in order to spectrally resolve the light sensor response.

FIG. 5 shows a further embodiment in which a device is provided that spectrally decomposes the light before sensing by the photosensitive array, in order to spectrally resolve the light sensor response. It shows detector grating 500, which (optionally) splits reflected beam 510, subsequent to reflection from the measurement area, into extraordinary component 520$_e$ and ordinary component 520$_o$. A prism 525 (or other device that can spectrally decompose the rays such as a grating) is provided. The resultant spectrally decomposed rays 530$_e$, 530$_o$ are detected using photosensitive detector array 540. Photosensitive detector array 540 can be seen to comprise (in this specific embodiment) two arrays 550$a$, 550$b$ and optional detector for capture spots 560.

In this embodiment, the x-direction on the photosensitive array resolves the x-position on the wafer. The y-direction on the photosensitive array resolves the wavelength. Knowing the wavelength offers extended possibilities in wafer height reconstruction, which can help to further reduce the process dependency. Spectral components may be separately weighted when calculating the wafer height. For example, the contribution of wavelengths that are sensitive to the measured product may be given a lower weight (or be discounted completely) when calculating the wafer height. Or else, a specific combination of wavelengths may be selected that lead to a negligible process dependency for a certain product stack. This is not possible presently, as all wavelengths are given a weight that is fully predetermined by the level sensor optical hardware.

In view of the above, it can be concluded that the level sensor according to the invention provides great flexibility and reliability with respect to the determination of one or more height levels of a surface of the substrate within the measurement area, and to determine a height map of a substrate surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A level sensor configured to determine a height level of a surface of a substrate, comprising:
a projection unit configured to project a measurement beam on a measurement area of the substrate;
a detection unit configured to receive the measurement beam after reflection on the substrate, wherein the detection unit comprises an array of detection elements and each detection element is arranged to receive a part of the measurement beam reflected on a measurement subarea of the measurement area, and is configured to provide a measurement signal based on the part of the measurement beam; and
a processing unit configured to:
determine a resolution for the measurement area;
calculate a height level of the measurement subarea based on the measurement signal of one detection element associated with the measurement subarea in response to determining a high resolution for the measurement area; and
calculate a height level of a combination of multiple measurement subareas within the measurement area based on measurement signals of multiple detection elements associated with the combination of multiple measurement subareas in response to determining a low resolution for the measurement area.

2. The level sensor of claim 1, wherein the processing unit is further configured to disregard a given one of the measurement signals associated with one of the detection elements associated with one of the measurement subareas, of which a height level is at least one of undesirable, unreliable and non-interesting in a height map of the substrate surface.

3. The level sensor of claim 1, wherein the processing unit is further configured to calculate a first height level of a first combination of a first number of multiple measurement subareas within the measurement area, and to calculate a second height level of a second combination of a second number of multiple measurement subareas within the measurement area, wherein the first number and second number are different and selected based on the determined resolution in the first combination and the second combination.

4. The level sensor of claim 1, wherein the array of detection elements is a continuous array of detection elements.

5. The level sensor of claim 1, wherein the array of detection elements is a CMOS or CCD sensor.

6. The level sensor of claim 1, wherein the projection unit comprises a single light source covering the whole measurement area.

7. The level sensor of claim 1, wherein the projection unit comprises a projection grating arranged to receive the measurement beam and to impart the measurement beam with a pattern, and wherein the detection unit comprises a detection grating arranged to receive the reflected measurement beam, before the measurement beam is received by the array of detection elements.

8. The level sensor of claim 1, wherein the resolution for the measurement area is determined based on one or more of the measurement signals of the detection elements.

9. The level sensor of claim 1, wherein the resolution for the measurement area is determined based on a feature layout on the substrate surface.

10. The level sensor of claim 1, wherein the resolution for the measurement area is determined based on historical data.

11. The level sensor of claim 10, wherein the historical data comprises at least one of wafer-to-wafer data and interfield fingerprint data.

12. The level sensor of claim 1, wherein the detection unit is further configured to separate the measurement beam into its ordinary and extraordinary components, and to separately detect the ordinary and extraordinary components.

13. The level sensor of claim 12, wherein the processing unit is further configured to calculate the height level within the measurement area based on an intensity contrast of the ordinary and extraordinary components.

14. The level sensor of claim 1, wherein the detection unit comprises a spectral decomposer for spectrally decomposing the reflected measurement beam.

15. The level sensor of claim 14, wherein the array of detection elements in a first direction resolves position on the measurement area, and the array of detection elements in a second direction, orthogonal to the first direction, resolves the wavelength of the measurement beam.

16. The level sensor of claim 15, wherein the processing unit is further configured to selectively apply weighting to different spectral components of the detected measurement beam when calculating the height level within the measurement area.

17. A method for determining a height map of a substrate for use in a lithographic process using a level sensor, comprising:
determining a height level of a measurement subarea or a combination of measurement subareas within a measurement area comprising:
projecting a measurement beam on the substrate by a projection unit,
receiving a reflected beam by a detection unit,
determining a resolution for the measurement area,
calculating a height level of the measurement subarea based on a measurement signal of one detection element associated with the measurement subarea in response to determining a high resolution for the measurement area, and
calculating a height level of the combination of multiple measurement subareas within the measurement area based on measurement signals of multiple detection elements associated with the combination of multiple measurement subareas in response to determining a low resolution for the measurement area.

18. The method of claim 17, comprising repeating the determining a height level for multiple measurement areas on the substrate to obtain the height map of a complete surface of the substrate.

19. The method of claim 17, wherein the resolution for the measurement area is determined based on at least one of one or more of the measurement signals of the detection elements, and a feature layout on the substrate surface.

20. The method of claim 17, wherein the resolution for the measurement area is determined based on historical data.

21. The method of claim 20, wherein the historical data comprises at least one of wafer-to-wafer data and interfield fingerprint data.

22. The method of claim 17, further comprising:
separating the measurement beam into its ordinary and extraordinary components, and separately detecting the ordinary and extraordinary components.

23. The method of claim 22, further comprising:
calculating the height level within the measurement area based on an intensity contrast of the ordinary and extraordinary components.

24. The method of claim 17, further comprising:
spectrally decomposing the reflected measurement beam, and selectively applying weighting to different spectral components of the detected measurement beam when calculating the height level within the measurement area.

25. A lithographic apparatus comprising:
an illumination system configured to condition a radiation beam;
a support configured to support a patterning device, the patterning device being capable of imparting the radiation beam with a pattern in its cross-section to form a patterned radiation beam;
a substrate table configured to hold a substrate; and
a projection system configured to project the patterned radiation beam onto a target portion of the substrate,
wherein the lithographic apparatus comprises a level sensor configured to determine a height level of a surface of the substrate supported on the substrate table, comprising:
  a projection unit configured to project a measurement beam on a measurement area of the substrate,
  a detection unit configured to receive the measurement beam after reflection on the substrate, wherein the detection unit comprises an array of detection elements and each detection element is arranged to receive a part of the measurement beam reflected on a measurement subarea of the measurement area, and is configured to provide a measurement signal based on the part of the measurement beam, and
  a processing unit configured to:
    determine a resolution for the measurement area,
    calculate a height level of the measurement subarea based on the measurement signal of one detection element associated with the measurement subarea in response to determining a high resolution for the measurement area, and
    calculate a height level of a combination of multiple measurement subareas within the measurement area based on measurement signals of multiple detection elements associated with the combination of multiple measurement subareas in response to determining a low resolution for the measurement area.

26. A level sensor configured to determine a height level of a surface of a substrate, comprising:
  a detection unit configured to receive a measurement beam, wherein the measurement beam results by reflection of a beam off a measurement area of the substrate, the beam being projected by a projection unit, wherein the detection unit comprises an array of detection elements and each detection element is arranged to receive a part of the measurement beam reflected on a measurement subarea of the measurement area, and is configured to provide a measurement signal based on the part of the measurement beam; and
  a processing unit configured to:
    determine a resolution for the measurement area,
    calculate a height level of the measurement subarea based on the measurement signal of one detection element associated with the measurement subarea in response to determining a high resolution for the measurement area, and
    calculate a height level of a combination of multiple measurement subareas within the measurement area based on measurement signals of multiple detection elements associated with the combination of multiple measurement subareas in response to determining a low resolution for the measurement area.

27. The level sensor of claim 26, wherein the processing unit is further configured to disregard a given one of the measurement signals associated with one of the detection elements associated with one of the measurement subareas, of which a height level is at least one of undesirable, unreliable and non-interesting in a height map of the substrate surface.

28. The level sensor of claim 26, wherein the processing unit is further configured to calculate a first height level of a first combination of a first number of multiple measurement subareas within the measurement area, and to calculate a second height level of a second combination of a second number of multiple measurement subareas within the measurement area, wherein the first number and second number are different and selected based on the determined resolution in the first combination and the second combination.

29. The level sensor of claim 26, wherein the array of detection elements is a continuous array of detection elements.

30. The level sensor of claim 26, wherein the array of detection elements is a CMOS or CCD sensor.

31. The level sensor of claim 26, wherein the projection unit comprises a single light source covering the whole measurement area.

32. The level sensor of claim 26, wherein the projection unit comprises a projection grating configured to impart the beam with a pattern, and wherein the detection unit comprises a detection grating arranged to receive the measurement beam, before the measurement beam is received by the array of detection elements.

33. The level sensor of claim 26, wherein the resolution for the measurement area is determined based on one or more of the measurement signals of the detection elements.

34. The level sensor of claim 26, wherein the resolution for the measurement area is determined based on a feature layout on the substrate surface.

35. The level sensor of claim 26, wherein the resolution for the measurement area is determined based on historical data.

36. The level sensor of claim 35, wherein the historical data comprises at least one of wafer-to-wafer data and interfield fingerprint data.

37. The level sensor of claim 26, wherein the detection unit is further configured to separate the measurement beam into its ordinary and extraordinary components, and to separately detect the ordinary and extraordinary components.

38. The level sensor of claim 37, wherein the processing unit is further configured to calculate the height level within the measurement area based on the intensity contrast of the ordinary and extraordinary components.

39. The level sensor of claim 26, wherein the detection unit comprises a spectral decomposer for spectrally decomposing the reflected measurement beam.

40. The level sensor of claim 39, wherein a first direction of the array of detection elements resolves position on the measurement area, and a second direction of the array of detection elements, orthogonal to the first direction, resolves the wavelength of the measurement beam.

41. The level sensor of claim 39, wherein the processing unit is further configured to selectively apply weighting to different spectral components of the detected measurement beam when calculating the height level within the measurement area.

42. A method for determining a height level of a subarea or a combination of subareas within a measurement area of a substrate, comprising:
- projecting a measurement beam on the substrate by a projection unit;
- receiving a reflected beam by a detection unit;
- determining a resolution for the measurement area,
- calculating a height level of each measurement subarea based on a measurement signal of one detection element associated with the measurement subarea in response to determining a high resolution for the measurement area, and
- calculating a height level of the combination of multiple measurement subareas within the measurement area based on measurement signals of multiple detection elements associated with the combination of multiple measurement subareas in response to determining a low resolution for the measurement area.

43. The method of claim 42, further comprising:
- repeating the determining a height level step for multiple measurement areas on the substrate to obtain the height map of a complete surface of the substrate.

44. The method of claim 42, wherein the resolution for the measurement area is determined based on at least one of one or more of the measurement signals of the detection elements and wherein the resolution at the measurement area is determined based on a feature layout on the substrate surface.

45. The method of claim 42, wherein the resolution for the measurement area is determined based on historical data.

46. The method of claim 45, wherein the historical data comprises wafer-to-wafer data and/or interfield fingerprint data.

47. The method of claim 42, further comprising:
- separating the measurement beam into its ordinary and extraordinary components, and separately detecting the ordinary and extraordinary components.

48. The method of claim 47, further comprising:
- calculating the height level within the measurement area based on an intensity contrast of the ordinary and extraordinary components.

49. The method of claim 42, further comprising:
- spectrally decomposing the reflected measurement beam, and selectively applying weighting to different spectral components of the detected measurement beam when calculating the height level within the measurement area.

* * * * *